United States Patent [19]
Atherly et al.

[11] Patent Number: 5,140,198
[45] Date of Patent: Aug. 18, 1992

[54] IMAGE CANCELING MIXER CIRCUIT ON AN INTEGRATED CIRCUIT CHIP

[75] Inventors: Don H. Atherly; Carl R. Battjes, both of Portland, Oreg.

[73] Assignees: Seiko Corporation; Seiko Epson Corporation, both of Japan

[21] Appl. No.: 400,186

[22] Filed: Aug. 30, 1989

[51] Int. Cl.$^5$ .......................... H04B 1/10; H04B 1/26
[52] U.S. Cl. ................................... 307/529; 307/520; 328/165; 455/302
[58] Field of Search ............... 455/302, 303, 304, 305; 307/491, 262, 520, 521, 529; 328/55, 165, 167, 155

[56] References Cited

U.S. PATENT DOCUMENTS

| | | | |
|---|---|---|---|
| 4,349,916 | 9/1982 | Roeder | 328/166 |
| 4,414,686 | 11/1983 | Lenz | 455/302 |
| 4,584,715 | 4/1986 | Baars et al. | 455/302 |
| 4,696,055 | 9/1987 | Marshall | 455/302 |
| 4,710,975 | 12/1987 | Okamoto et al. | 455/304 |

OTHER PUBLICATIONS

Howell et al., "Image-Cancelling Mixers", Electronic Letters, Jul. 13, 1972, vol. 18, No. 14, pp. 352-354.

Primary Examiner—Timothy P. Callahan
Attorney, Agent, or Firm—Elmer Galbi

[57] ABSTRACT

An IF mixer circuit in a receiver implemented in integrated circuits employs a pair of doubly balance mixers, one injected with a local oscillator reference signal in phase while the quadrature phase of the reference signal is injected into the second mixer. A phase shift circuit adds another 90° phase shift to the output of the second mixer, and the in-phase and out-of-phase signals are applied to a summing circuit to attenuate unwanted mixer products and reinforce the desired IF signal. The balanced elements of the 90° phase shift circuit employ a transistor with equal emitter and collector resistances, a diode-connected transistor in series with the collector load resistance, and a collector-to-base capacitor, which provide a constant-amplitude phase shift in a unity gain structure independent of current, to produce a precise 90° phase shift. Emitter current is adjustable to compensate for production variation in the absolute value of the fixed resistance, i.e., by varying the current in the transistor and diode, the dynamic resistance offsets the fixed resistance variation.

5 Claims, 3 Drawing Sheets

IMAGE CANCELING MIXER CIRCUIT ON AN INTEGRATED CIRCUIT CHIP

FIELD OF THE INVENTION

This invention relates generally to telecommunications and particularly to an integrated circuit frequency conversion circuit.

BACKGROUND OF THE INVENTION

Copending patent application Ser. No. 07/213,719 filed June 30, 1988 by Lawrence H. Ragan and entitled *Wristwatch Receiver Architecture* describes an FM radio receiver suitable for paging applications, and constructed on a single integrated circuit chip having only a small number of off-chip components. It is desirable to minimize the number of discrete, off-chip components because it reduces the cost of the unit, provides additional space in the package formerly occupied by the discrete components, and makes the device less labor-intensive to assemble.

A mixer circuit in a receiver translates a signal received at one frequency to another frequency, termed an intermediate frequency (IF), at which the signal can be processed more conveniently and effectively. The intermediate frequency facilitates processing, filtering and detecting a signal with greater ease and efficiency than would be possible were the signal kept at the radio frequency at which it was transmitted and propagated. A problem inherent in all mixer circuits is generation of image frequency signals. When two signals are mixed, signal components are produced at the sum and difference of the two signal frequencies and at the harmonics of the frequencies. It is desirable to reduce or eliminate the image-frequency response of the mixer circuit, however it is often impractical to filter out the image frequency. Post-mixer filtering has been found to be inadequate because input signal images can be mixed to the same intermediate frequency as the desired signal. Image-rejection mixer circuits utilizing phase-shifting techniques are known, however such circuits have heretofore used transmission lines, operational amplifiers or L-C networks, none of which are conducive to implementation in a singlechip integrated circuit receiver.

SUMMARY OF THE INVENTION

According to the present invention, a single-chip integrated circuit radio receiver, which is designed for use in a radio paging system, includes an improved on-chip image-rejection mixer circuit. An amplified, wide-band RF input signal is split and applied to inputs of first and second doubly balanced mixers, while a local oscillator signal is injected into the first mixer in phase, and shifted in phase by 90° into the second mixer. The quadrature outputs of the second mixer are applied to a balanced phase shift element where the signals are shifted an additional 90°, and then combined with the outputs of the in-phase mixer, the summation of these signals canceling the image frequency while reinforcing the desired signal.

The balanced 90° phase shift element employs transistors each having a diode-connected transistor in series with the collector load resistor, and a collector-to-base capacitor, which provide a constant-amplitude phase shift in a unity gain structure independent of current, with equal emitter and collector resistances. Emitter current is adjustable to produce a precise 90° phase shift. The adjustment compensates for production variation in the absolute value of the fixed resistance by varying the current in the transistor and diode, whereby the dynamic resistance offsets the fixed resistance variation. The improved mixer circuit has a conversion gain at the desired signal frequency of approximately 7 dB.

BRIEF DESCRIPTION OF THE DRAWING

While the invention is set forth with particularity in the appended claims, other objects, features, the organization and method of operation of the invention will become more apparent, and the invention will best be understood by referring to the following detailed description in conjunction with the accompanying drawing in which:

DESCRIPTION OF THE PREFERRED EMBODIMENT

Figure 1:
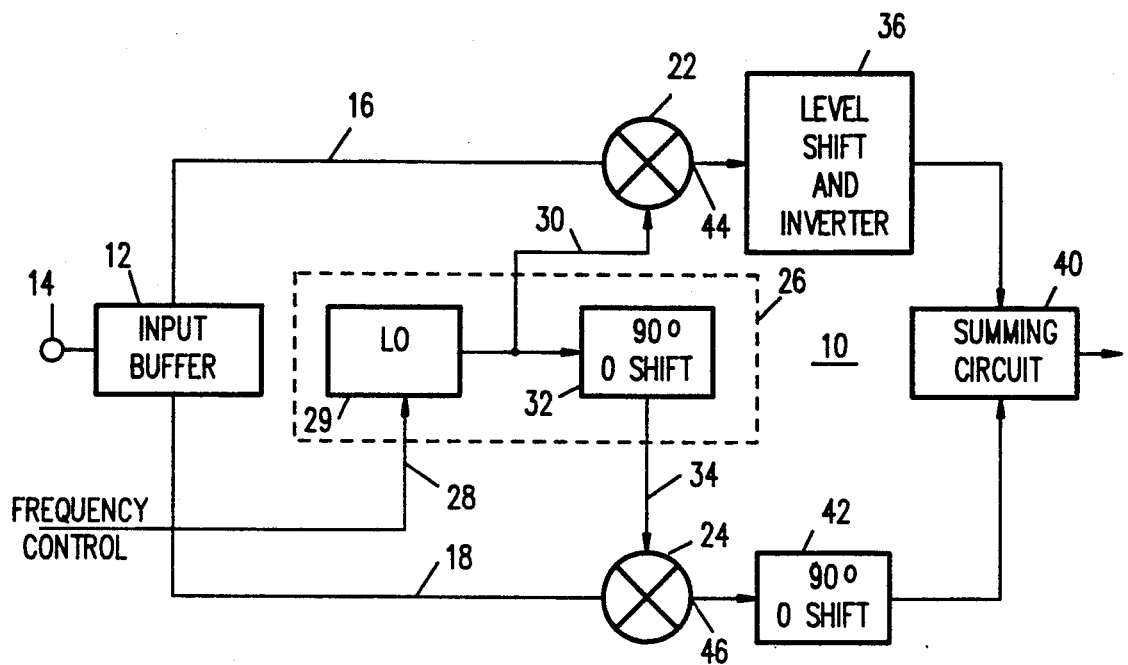
FIG. 1 is a block diagram of an improved image-rejecting mixer circuit in accordance with the instant invention.

Referring now to the various views of the drawing for a more detailed description of the components, materials, construction, function, operation and other features of the instant invention by characters of reference, FIG. 1 shows an image-rejecting mixer circuit 10 having an input buffer 12 receiving an amplified, broadband radio frequency (RF) signal, suitably in the FM broadcast band, 88-108 megahertz, on an input node 14 from a receiver RF stage (not shown). The buffered RF signal, split in a conventional manner, is applied respectively by way of buses 16, 18 to the low-level signal inputs of doubly-balanced mixers 22, 24. A frequency synthesizer 26, assuming high-side injection, tunes the 98.7 to 118.7 megahertz range in response to frequency control signal 28 to yield an IF of 10.7 megahertz. A local-oscillator (LO) 29 operating in the 240 megahertz range generates an in-phase signal from a conventional divide-by-two frequency divider circuit (not shown), which is applied via bus 30 to the high-level signal input of the mixer 22.

The phase of the LO signal is shifted 90° in phase-shift circuit 32 and applied by way of bus 34 to the high-level input of the mixer 24. A precise 90° phase shift is obtained by utilizing the quadrature output logically derived from an exclusive OR of the fundamental output of the local oscillator 29 and the divide-by-two frequency divider circuit. The output signals of the in-phase mixer 22 are applied through a level shift and inverter circuit 36 to a summing circuit 40, while the output signals of the 90° mixer 24 are applied to a phase shift circuit 42, where they are inverted and shifted in phase an additional 90°, then applied to the summing circuit 40. Phase difference of the signals is preserved in the frequency transformation of the mixers 22, 24, so that the IF components output have the same phase relationships as the original LO input terms, i.e., the signals output from the in-phase mixer 22 at node 44 undergo no phase shift and are downconverted in the conventional manner, while the signals output from the 90° mixer 24 at node 46 undergo a 90° delay relative to those at the node 44.

Figure 2:
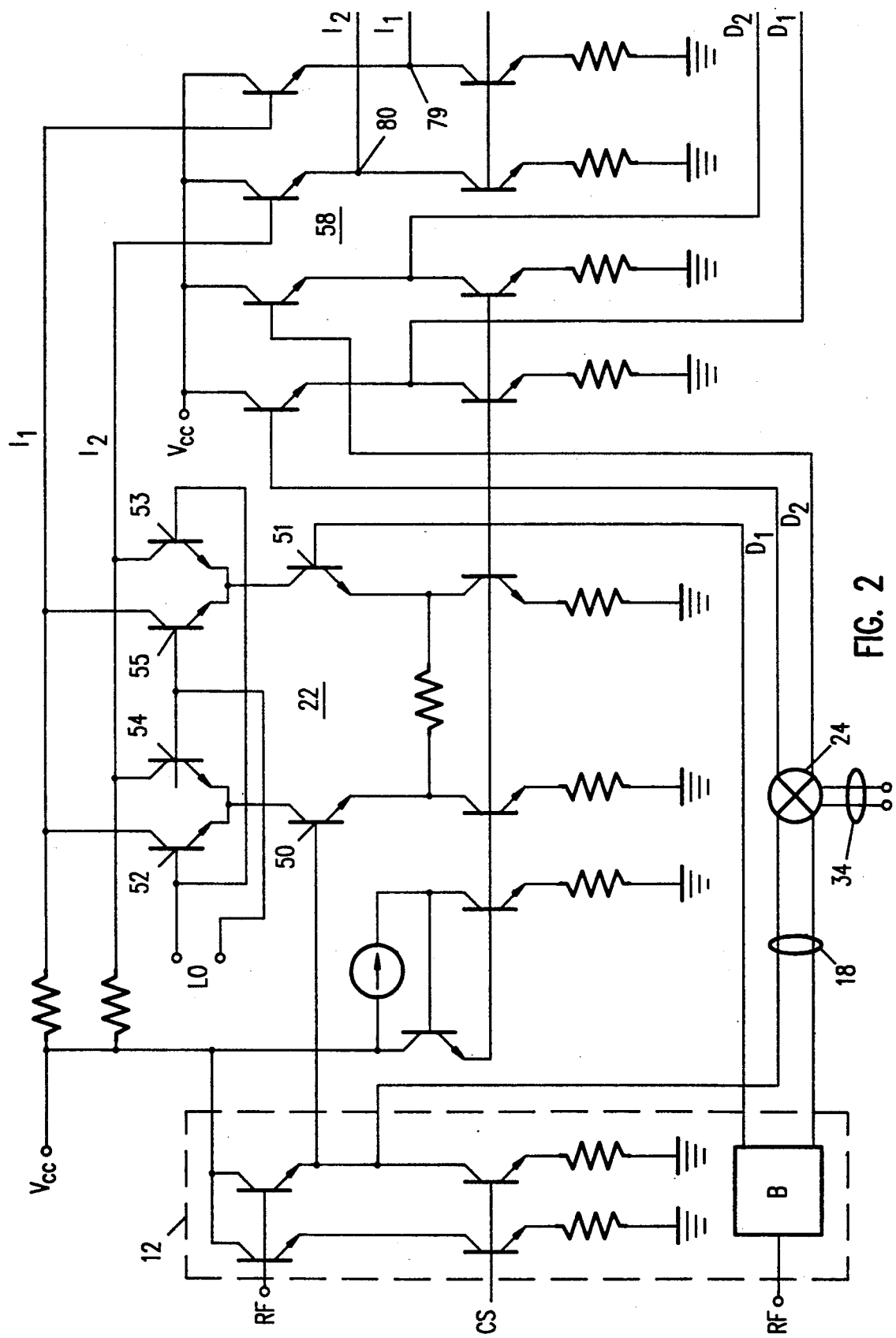
FIGS. 2 and 3, taken together, are a schematic diagram of the circuit of FIG. 1.
Figure 3:
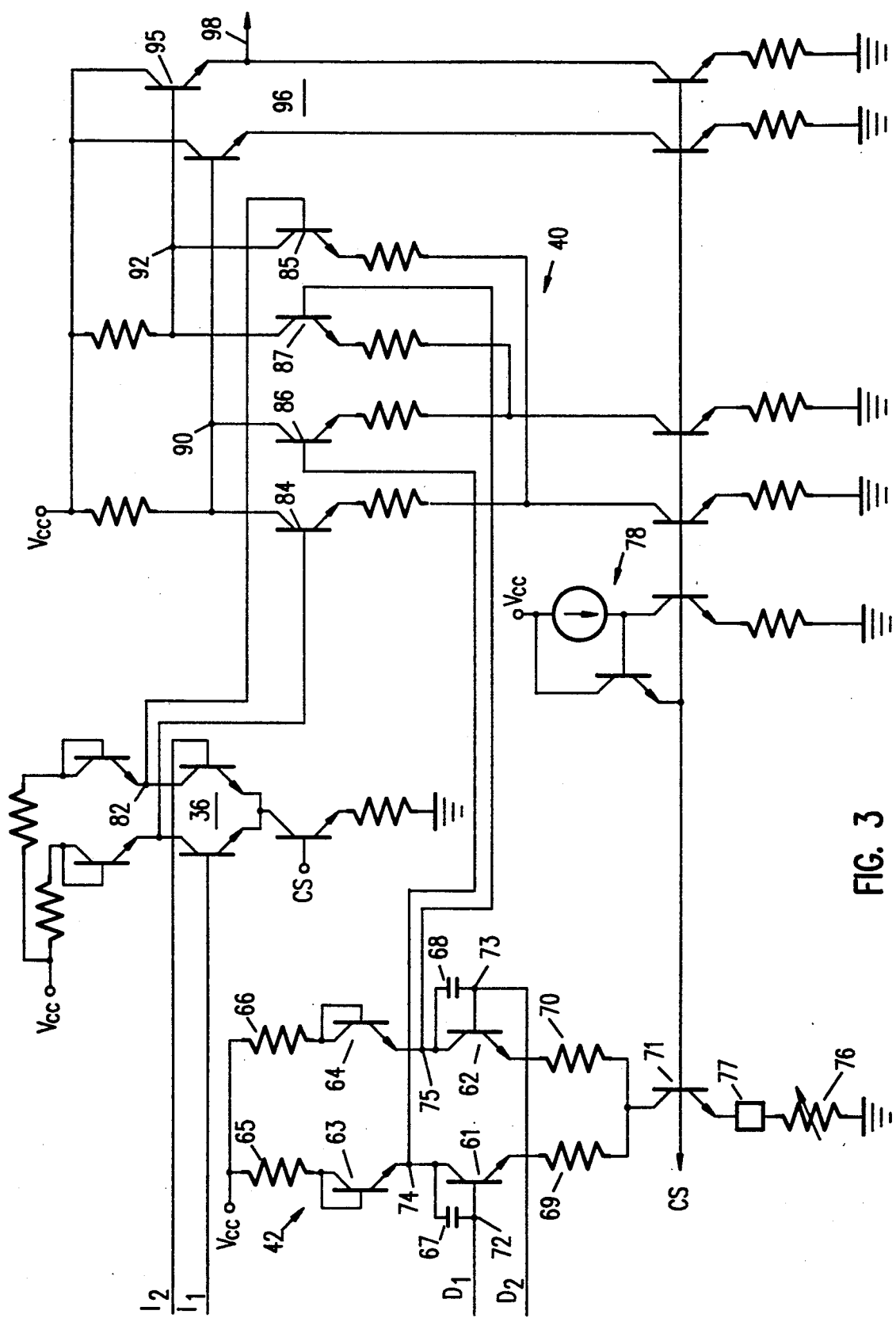

Referring to FIGS. 2 and 3, the circuit of FIG. 1 is shown in greater detail. The input buffer 1 and the in-phase mixer 22, which is a conventional integrated circuit doubly balanced mixer, receives the low-level RF signals from the input buffers 12 into the bases of transistors 50, 51, the high-level, in-phase LO signals being injected into the bases of transistors 52-55. Mixer 22 output signals $I_1$, $I_2$ and mixer 24 output signals $D_1$, $D_2$ are applied to level shifting circuits 58, which are emitter-follower transistors. Current regulating transistors 60 provide impedance matching between the mixers 22, 24, and the respective circuits 36, 42.

Figure 4:
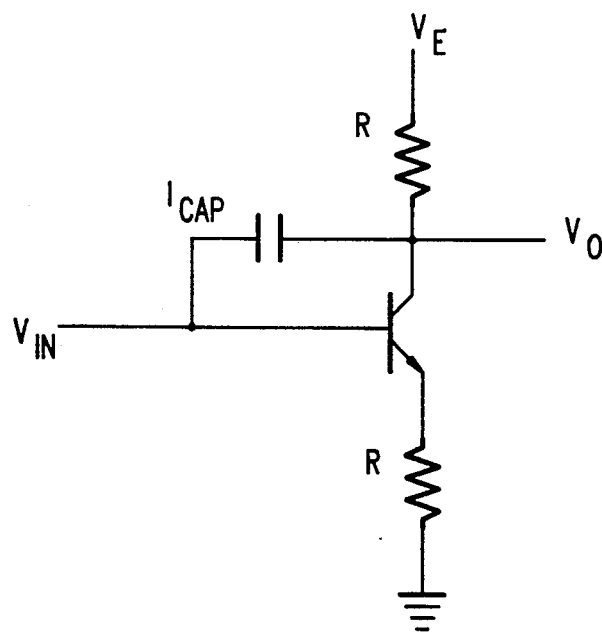
FIG. 4 is an idealized representation of the 90° phase shift circuit of FIG. 2.

Phase shifter circuit 42 comprises two balanced circuits receiving the balanced output signals $D_1$, $D_2$ from the mixer 24 and input respectively to the bases of transistors 61, 62. The collectors of transistors 61, 62 are connected through respective diode-connected transistors 63, 64 and 500 ohm emitter resistors 65, 66 to voltage supply $V_{CC}$. Balanced MOS capacitors 67, 68 are connected respectively between the emitter and base of transistors 61, 62, and 500 ohm resistors 69, 70 are connected respectively between the emitters of transistors 61, 62 and the collector of a current-source transistor 71. The circuit 42 provides an all-pass filter transfer function for the differential voltage between base nodes 72, 73 to the output differential voltage at output nodes 74, 75. The circuit 42 has a nominal unity gain transfer function with a phase shift equal to $-2 \arctan(R'C)$, where $R'$ is $R+(KT/I_cq)$, and $I_c$ is quiescent collector current. The derivation is as follows: Referring to FIG. 4, an idealized representation of the 90° phase shift circuit 42 is shown, wherein beta · and transconductance gm are assumed to be infinity ∞. It is seen that for AC quantities:

$$I_R := V_E/R$$

and $$V_o := (I_{cap} - I_R) \cdot R$$

Substituting
$V_o := (I_{cap} - V_E/R) \cdot R$
$V_{in} := V_E$
$V_o := I_{cap} R - V_{in}$
$V_o := (V_{in} - V_o) \cdot C \cdot S \cdot R - V_{in}$, where C·S is admittance;
$V_o := V_{in}[(-1 + R \cdot C \cdot S)/(1 + R \cdot C \cdot S)]$
$V_o := -[(1 - R \cdot C \cdot S)/(1 + R \cdot C \cdot S)] \cdot V_{in}$
The above is a one-pole, all pass filter function.

The function of diode-connected transistors 63, 64 is to achieve a collector load resistance equal to the emitter resistance plus dynamic emitter resistance, thereby obtaining a unity gain characteristic. The dynamic resistance term $KT/I_cq$ facilitates adjustment of the total resistance and the R'C time constant to a value which will produce a 90° phase shift at a frequency $f=1/(R'C)$. The emitter current is variable by way of an external resistor 76 connected to a bonding pad 77 of the integrated circuit chip. The emitter current source transistor 71 mirrors a circuit 78 which is a proportional-to-absolute-temperature (PTAT) bias current source; therefore, the incremental resistance of the diodes 63, 64 is maintained over a temperature range, providing a stable resistance and time constant as a function of temperature. Since the collector load tracks the emitter load as current is varied, unity gain is preserved and only the phase is varied.

The level shift and inverter circuit 36 provides a gain block for the in-phase signals $I_1$, $I_2$ of mixer 22 input respectively by way of output nodes 79, 80 of the level shifting circuit 58. The circuit 36 adjusts for losses in the signal path. The summing circuit 40 sums the in-phase signals from nodes 81, 82 and the out-of-phase signals from nodes 74, 75, injected, respectively, into the bases of transistors 84-87, the summation occurring at nodes 90, 92 where the collector currents, respectively, of transistors 84, 86 and 85, 87 are added together. Output signals at the nodes 90, 92 are driven into the bases, respectively, of balancing transistor 94 and output transistor 95 of output circuit 96, which provides an output signal at a node 98 to a single ended filter stage (not shown).

The delay of the $D_2$ signal output from node 99 of the mixer 24 is manifest by a negative 90° phase shift in the positive frequency components and a positive 90° phase shift in the negative frequency components. When the $D_2$ signal is then subjected to the additional 90° delay of the circuit 42 at node 69, the IF components from the upper sideband terms have been shifted 180° and the lower sideband terms again remain unchanged. When the $D_2$ and $I_2$ signals are summed at node 92 in the summing circuit 40, the upper sideband components cancel and the unshifted lower sideband terms remain. By the same rationale, the other output at the node 90 contains the desired upper sideband terms of the IF signal.

The mixer circuit thus, by virtue of its symmetry and internal balance, reinforces the desired signal and suppresses and substantially attenuates harmonic and image frequency products. Efficient phase cancellation is achieved through the ability to maintain extremely accurate phase angles. The initial 90° phase shift is derived digitally in a frequency synthesizer circuit, while the phase shift circuit 42 provides a constant-amplitude phase shift in a unity gain structure independent of current, with equal emitter and collector resistances, the emitter current being adjustable to produce the second, precise 90° phase shift. The adjustment compensates for production variation in the absolute value of the fixed resistance by varying the current in the transistors 61, 62 and diodes 63, 64, whereby the dynamic resistance offsets production variation of the fixed resistance.

While the principles of the invention have now been made clear in the foregoing illustrative embodiment, there will be immediately obvious to those skilled in the art many modifications of structure, arrangement, proportions, the elements, material and components used in the practice of the invention, and otherwise, which are particularly adapted for specific environments and operating requirements without departing from those principles. The appended claims are, therefore, intended to cover and embrace any such modifications, within the limits only of the true spirit and scope of the invention.

We claim:
1. An image-rejecting mixer circuit on an integrated circuit chip, comprising:
   first and second mixers each receiving a radio frequency signal, the first mixer receiving a local-oscillator reference signal, the second mixer receiving the local-oscillator reference signal shifted in phase by 90 degrees, said first mixer producing a first mixed output and said second mixer producing a second mixed output;
   a phase-shift circuit coupled to the second mixer and receiving said second mixed output therefrom, said phase-shift circuit delaying the second mixed output signals an additional 90 degrees and including means for adjusting the phase angle of the signal output therefrom; and a summing circuit coupled to the first mixer and the 90 degree phase-shift circuit, the summing circuit combining in-phase components of said first mixed output from the first mixer with said second mixed output signals of the second mixer delayed by 180 degrees, to produce a combined signal which has image frequency components, said phase-shaft circuit comprising a unity gain transistor amplifier having a transistor with a base, a collector, and an emitter, a base circuit receiving the converted product signals from said second mixer, a collector to base capacitor, an emitter load including a fixed resistor, and a collector load including a fixed resistor in series with a diode-connected transistor, the adjusting means including an adjustable emitter load resistor, whereby a variation in emitter load current introduced by the adjustable resistor varies dynamic emitter resistance to compensate for production variations of the fixed resistors and produces an RC time constant which results in a 90 degree phase shift of the output signal, and whereby the image frequency components of the combined signals are substantially attenuated.

2. The mixer circuit of claim 1 further comprising a temperature compensating current source in the adjustable emitter load of the phase-shift circuit.

3. An integrated-circuit phase shift element comprising: a unity gain amplifier circuit having a transistor with a base receiving an input signal, a collector to base capacitor, an emitter load including a fixed resistor, and a collector load including a fixed resistor in series with a diode-connected transistor, the amplifier circuit having means for adjusting the phase angle of an output signal with respect to the input signal, the phase shift adjusting means including an adjustable emitter load resistor, whereby a variation in emitter load current introduced by the adjustable resistor varies dynamic emitter resistance to compensate for production variations of the fixed resistors and produces an RC time constant which results in a desired phase shift of the output signal with respect to the input signal, wherein collector load current tracks the varying emitter load current to preserve the unity gain of the amplifier circuit as the phase is varied.

4. The integrated-circuit phase shift element of claim 3 further comprising a temperature compensating current source in the emitter load of the unity gain amplifier circuit.

5. An image canceling mixer circuit including means for generating a first in-phase reference frequency signal; means for generating a second reference frequency signal shifted in phase by 90° with respect to the first reference frequency signal; first means receiving a radio frequency input signal for mixing the input signal with the first reference frequency signal to generate an in-phase composite signal; second means receiving the radio frequency input signal for mixing the input signal with the second reference frequency signal to generate a quadrature composite signal; means coupled to the second mixing means for shifting the phase of the quadrature composite signal an additional 90° to generate a composite signal shifted in phase by 180° with respect to the in-phase composite signal; means for summing the in-phase composite signal and the 180° composite signal to generate an intermediate frequency signal output having attenuated image-frequency components, the improvement comprising:

the phase shifting means including a unity gain amplifier circuit having an NPN transistor with a base receiving the quadrature composite signal, a collector to base capacitor, an emitter load including a fixed resistor, and a collector load including a fixed resistor in series with a diode-connected transistor, the amplifier circuit having means for adjusting the phase angle of the phase shift adjusting means and including an adjustable emitter load resistor, whereby a variation in the emitter load current introduced by the adjustable resistor varies dynamic emitter resistance to compensate for production variations of the fixed resistors and produces an RC time constant which results in a 90° phase shift of the output signal with respect to the input quadrature composite signal, the collector load current tracking the varying emitter load current to preserve the unity gain of the amplifier circuit as the phase is varied.

* * * * *